United States Patent
Kelkar et al.

(12) 
(10) Patent No.: US 6,327,158 B1
(45) Date of Patent: Dec. 4, 2001

(54) METAL PADS FOR ELECTRICAL PROBE TESTING ON WAFER WITH BUMP INTERCONNECTS

(75) Inventors: Nikhil Vishwanath Kelkar, Santa Clara; Pai-Hsiang Kao, Saratoga, both of CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/231,999

(22) Filed: Jan. 15, 1999

(51) Int. Cl.[7] ................................................ H05K 7/06
(52) U.S. Cl. .................... 361/779; 361/783; 361/772; 361/773; 361/774; 361/779; 438/612; 438/613; 438/616; 438/615; 438/652; 438/653; 438/654; 257/737; 257/738; 257/780; 257/781; 257/779; 257/750; 257/751
(58) Field of Search ................................... 257/737–738, 257/780–781, 779, 750, 751; 438/612–615, 652–654; 228/180.22; 29/830, 842, 843, 846, 854; 361/783, 772–774, 779

(56) References Cited

U.S. PATENT DOCUMENTS

| | | | |
|---|---|---|---|
| 5,329,423 | * | 7/1994 | Scholz ................................ 361/760 |
| 5,736,456 | * | 4/1998 | Akram ................................ 438/614 |
| 5,767,010 | * | 6/1998 | Mis et al. ............................. 438/614 |
| 5,773,359 | * | 6/1998 | Mitchell et al. ..................... 438/614 |
| 5,937,320 | * | 8/1999 | Andricacos et al. ................ 438/614 |
| 5,977,632 | * | 11/1999 | Beddingfield ...................... 257/737 |

* cited by examiner

*Primary Examiner*—Jeffrey Gaffin
*Assistant Examiner*—Thanh Y. Tran
(74) *Attorney, Agent, or Firm*—Beyer Weaver & Thomas LLP

(57) ABSTRACT

An improved integrated circuit device that includes both bond pads and trim pads is disclosed. Electrically conductive, non-wettable and non-corrosive protective caps are formed over each of the trim pads. With this arrangement, the protective caps act as barriers between the trim pads and solder used to form solder bumps when the IC package is mounted onto a substrate. In one embodiment, the protective caps are formed from a material that is easily sputtered, such as titanium. In a method aspect of the invention, the protective caps are applied during wafer level processing before either the solder bumping or trimming operations.

15 Claims, 6 Drawing Sheets

US 6,327,158 B1

METAL PADS FOR ELECTRICAL PROBE TESTING ON WAFER WITH BUMP INTERCONNECTS

CROSS REFERENCE TO RELATED APPLICATIONS

This application is related to commonly assigned U.S. patent application Ser. No. 09/031,167 filed Feb. 26, 1998, entitled, "Surface Mount Die: Wafer Lever Chip-Scale Package and Process for Making the Same" by Schaefer et al., now issued as U.S. Pat. No. 6,075,290, and U.S. patent application Ser. No. 09/006,759, filed Jan. 14, 1998 entitled "A Semiconductor Wafer Having A Bottom Surface Protective Coating" by Kao et al., now issued as U.S. Pat. No. 6,023,094, which are incorporated herein by reference.

BACKGROUND OF THE INVENTION

The present invention relates generally to integrated circuit devices with bond pads and trim pads. More particularly, the invention relates to integrated circuit devices having bond pads and trim pads on the surface that are manufactured in wafer form and improved configurations for trim pad protection so as to maintain electrical contact between the trim pads and the outside environment during final testing, yet protect the trim pads from environmental stresses, for example, preventing the trim pads from adhering to the contact bumps after the device is attached to an external substrate such as a circuit board.

A wafer level chip scale package (WLCSP) is a package design that is manufactured in wafer form and has overall dimensions substantially equal to that of the silicon die that is within the package. Bond pads on the die provide foundations for contact bumps which allow the die to connect with the outside world. FIG. 1 shows a diagrammatic side view of a silicon die 100 with a bond pad 102 having under bump metallurgy stack 104 and a contact bump 106 disposed above it. Passivation layers 108 and 110 are deposited over the silicon die 100 and the bond pad 102 and then etched away so that the under bump metallurgy stack 104 may be deposited over the bond pad 102. Electrical testing of the bond pads is performed in wafer form using known wafer probing techniques.

In addition to the contact bumps and the bond pads disposed below them, some types of IC devices may also have other metal pads called "trim pads" on the silicon die surface. FIG. 2 shows a diagrammatic top view of a die surface 200 with bond pads 202 and trim pads 204. These "trim pads" are used to trim the product—by driving known current at a specific voltage, product characteristics can be changed to fine tune the performance of an IC circuit device and ensure conformance to the specifications. The trim pads are generally formed from aluminum and thus they will corrode if left exposed in an ambient environment. Also, if they are left exposed when the singulated die is soldered to a substrate, there is a significant risk that the solder may bridge the gap between the particular bond pad pair, thereby shorting out the die. However, forming a protective layer requires a wafer processing operation after the trimming operation which is inefficient.

One approach is to cover the trim pads with a passivation material prior to placing the contact bumps to avoid corrosion. In this scenario, wafer testing must be done a first time to facilitate trimming, which must occur before the trim pads are insulated by the passivation material, and a second time to test for electrical function after the contact bumps have been placed on the dies. This two-part wafer probing process is inefficient, since the wafer must go to a testing facility for trimming, and subsequently, to a manufacturing facility to cover the trim pads and then back to the tester for the wafer probe before the dies are cut and shipped to customers. During the wafer probe testing, the trim pads are covered by insulation, and trimming is no longer possible. Therefore, IC devices that do not meet specifications are discarded even if their problems could have been solved by trimming. These inefficiencies add to the overall cost of manufacturing these IC devices.

The aforementioned problems all contribute to an increase in production cost or a decrease in production yield. Consequently, there is a need for an improved IC packaging to address the aforementioned problems.

SUMMARY OF THE INVENTION

To achieve the foregoing and other objects and according to the purpose of the present invention, an improved integrated circuit device that includes both bond pads and trim pads is disclosed. Under bump metallurgy stacks are formed over and in electrical contact with each of the bond pads and trim pads. Electrically conductive, non-wettable and non-corrosive protective caps are formed over each of the trim pad under bump metallurgy stacks. With this arrangement, the protective caps act as barriers between the trim pads and solder used to form solder bumps when the IC package is mounted onto a substrate.

In one embodiment, the protective caps are formed from a material that is easily sputtered, such as titanium. In a method aspect of the invention, the protective caps are applied during wafer level processing before either the solder bumping or trimming operations. In another embodiment, trimming is done after the solder bumping.

BRIEF DESCRIPTION OF THE DRAWINGS

The present invention is illustrated by way of example, and not by way of limitation, in the figures of the accompanying drawings and in which like reference numerals refer to similar elements and in which.

FIG, 3 is a diagrammatic side view of a die having a trim pad and an adjacent bond pad with a contact bump disposed above it, the die is inverted and mounted onto a portion of the circuit board.

Figure 4:
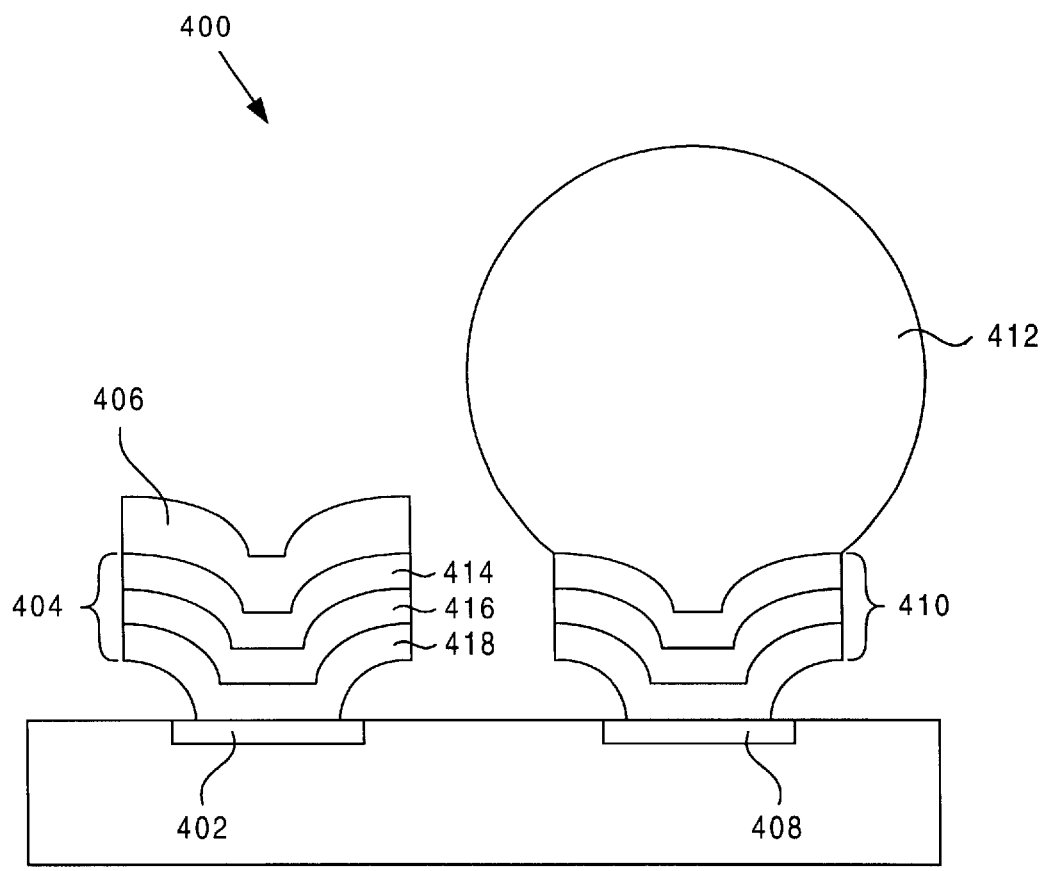

FIG. 4 is a diagrammatic side view of a die having a trim pad covered by an electrically conductive protective cap and an adjacent bond pad with a contact bump disposed above it in accordance with one embodiment of the present invention.

Figure 5A:
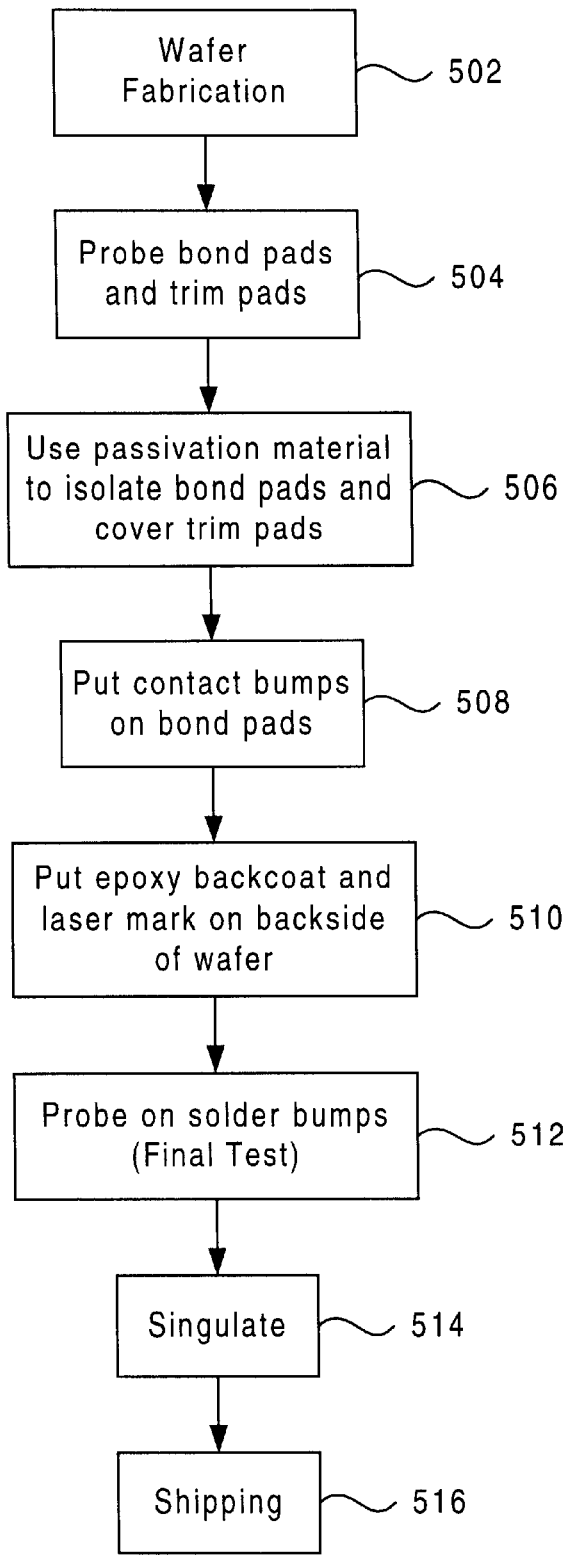

FIG. 5a is a flow chart illustrating a process of fabricating integrated circuit devices where the trim pads are covered with an insulating material that requires two separate wafer probing steps.

Figure 5B:
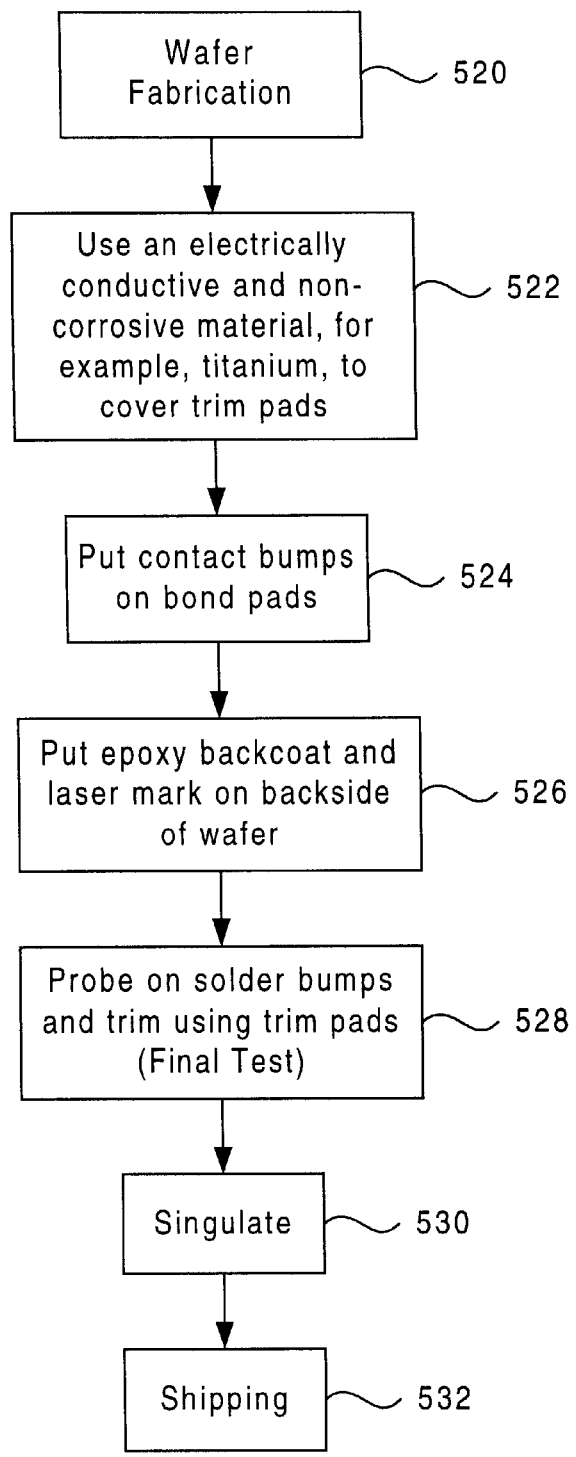

FIG. 5b is a flow chart illustrating a process of fabricating integrated circuit devices where the trim pads are covered with electrically conductive protective caps and only one wafer probing step is required in accordance with one embodiment of the present invention.

DETAILED DESCRIPTION OF THE INVENTION

A wafer level chip scale package (CSP) having bond pads and trim pads is described below. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

In general, the present invention relates to IC packages that include bond pads and trim pads. Each trim pad includes a protective cap that is formed over the trim pad. The protective caps act as barriers between the trim pads and the contact bumps of the package when the IC package is mounted onto an external substrate. The protective caps are formed from a material that ideally would be electrically conductive, oxidation resistant, non-corrosive, non-wettable, and easily sputtered. An example of such a material is titanium. Although the present invention is described as being implemented in wafer level chip scale packages, of course, it should be well understood to those skilled in the art that the present invention is not limited to these devices. That is, the present invention may be implemented on any IC package that utilizes trim pads, such as a flip chip package or any other chip packages.

Figure 1:
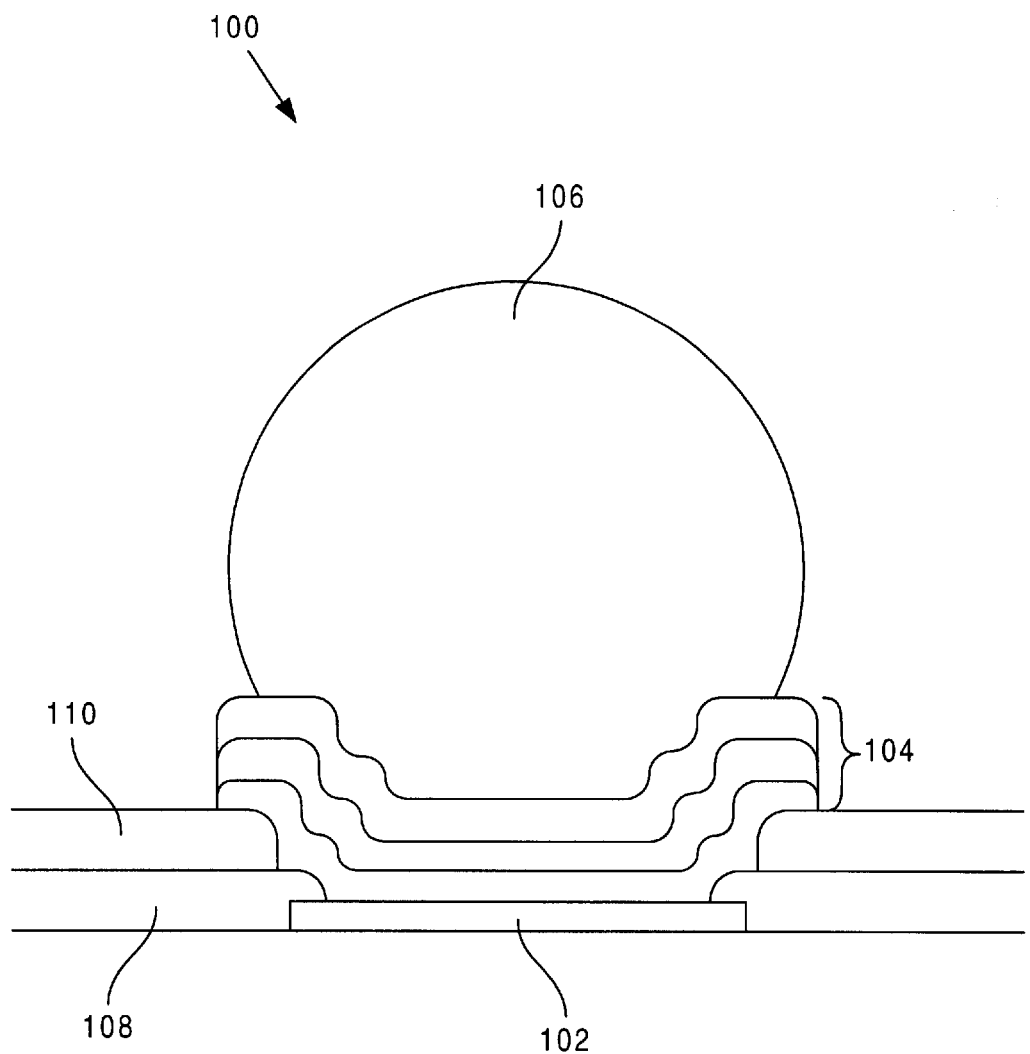
FIG. 1 is a diagrammatic side view of a bond pad and a contact bump region that includes an under bump metallurgy stack and a contact bump.
Figure 2:
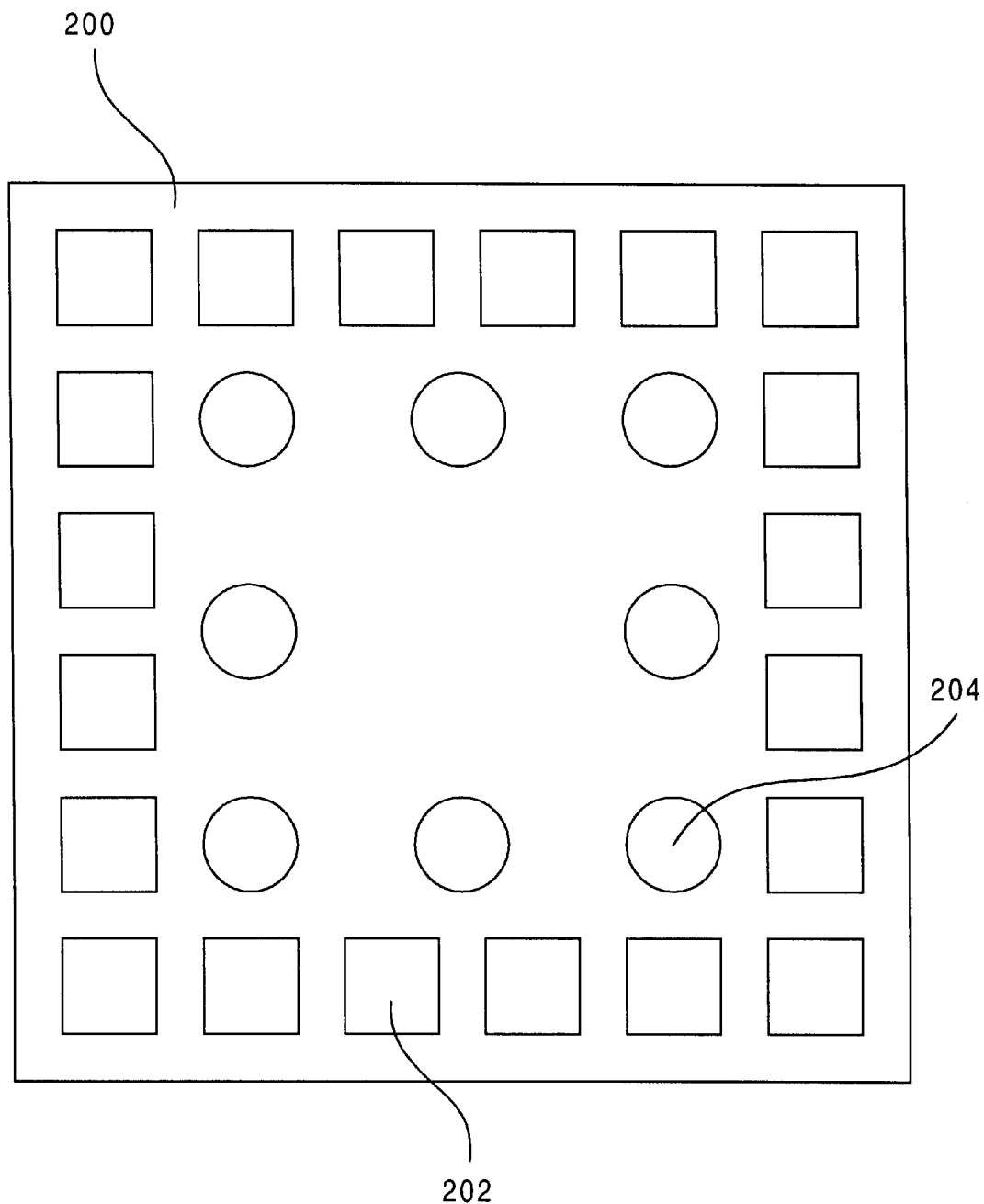
FIG. 2 is a diagrammatic top view of a die surface with bond pads and trim pads.
Figure 3:
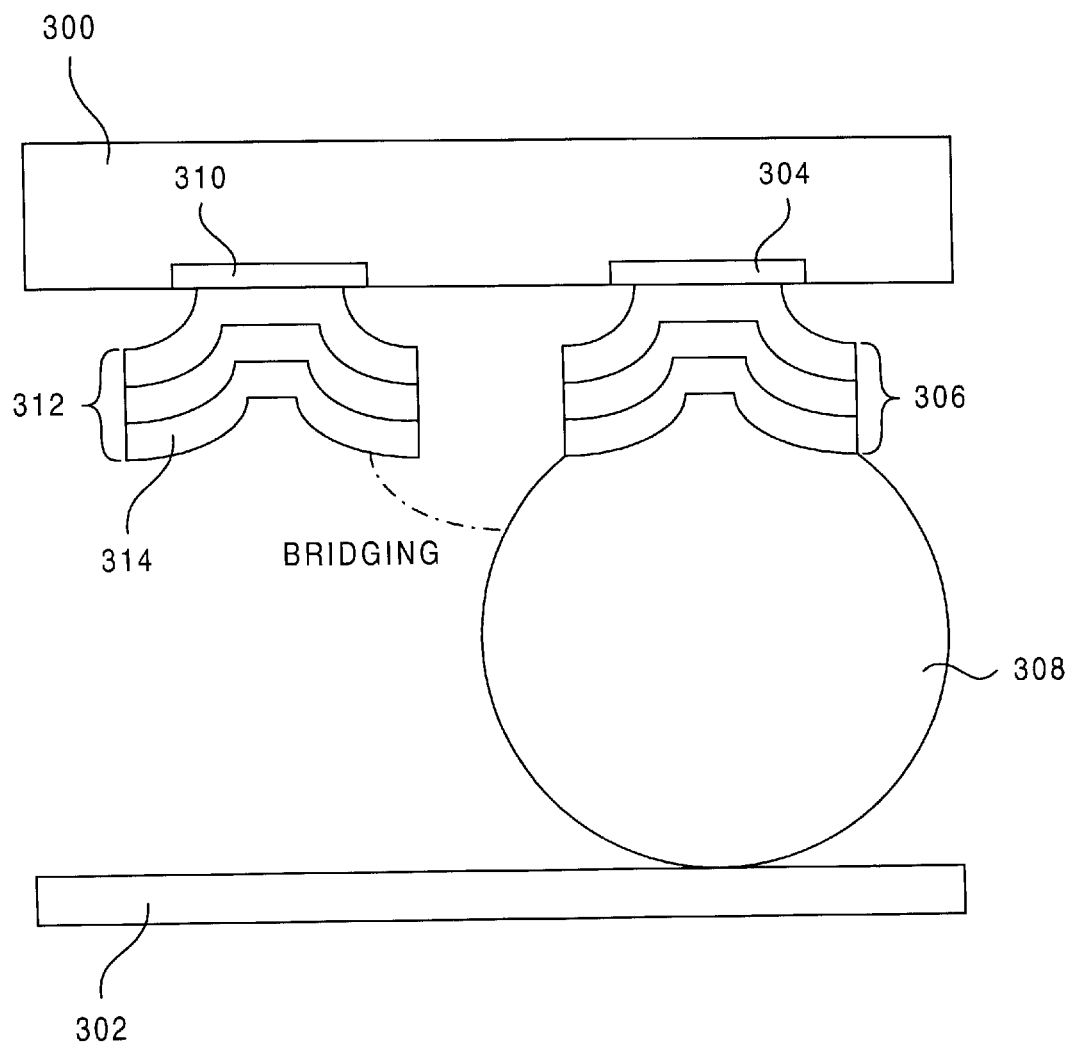

FIG. 3 shows a side view of a packaged die 300 mounted onto a circuit board 302. The die 300 has a bond pad 304 with an under bump metallurgy stack 306 deposited over it and a contact bump 308 disposed above the under bump metallurgy stack as well as a trim pad 310 with a under bump metallurgy stack 312 having a topmost copper layer 314. The topmost layer 314 of the under bump metallurgy stack covering the trim pad is copper, which may attract solder from the contact bump 308 when packaged die 300 is soldered to circuit board 302. This may result in a phenomenon known as "bridging", where solder inadvertently connects two adjacent areas of an integrated circuit device, in this case, the contact bump and the trim pad, which is equivalent to a short circuit in electrical circuitry. There are a variety of causes of bridging, as for example, poor lithography, particle contamination, underdeveloping, or etch problems. A possible alternative would be to place adjacent bond pads or trim pads a sufficient distance from one another so as to prevent bridging from occurring. However, this alternative solution to the bridging problem might result in inefficiencies that can be avoided by applying the present invention.

FIG. 4 is a diagrammatic side view of a portion of a die 400 having a trim pad 402 and a bond pad 408 in accordance with one embodiment of the invention. The trim pad 402 is covered by an under bump metallurgy stack 404 which in turn is covered by an electrically conductive protective cap 406. In one embodiment, the underbump metallurgy stack 404 may be formed of an underlayer 418 overlying the trim pad 402, an interlayer overlying the underlayer 416, and an overcoat 414 overlying the interlayer. In one embodiment, the underlayer 418 may be formed of Cr and the interlayer 416 may be formed of Cr—Cu. In another embodiment, the underlayer 418 may be formed of Al and the interlayer 416 may be formed of Ni—V. In a further embodiment, the underlayer 418 may be formed of TiW and the interlayer 416 formed of Cu. In some embodiments, the underbump metallurgy stack 410 may be formed similar to the underbump metallurgy stack 404. The bond pad 408 is covered by under bump metallurgy stack 410 with a contact bump 412 disposed above the under bump metallurgy stack 410. This die is fabricated among many others on the same wafer using conventional wafer fabrication techniques. During wafer processing, bond pads and trim pads are formed on the silicon substrate. Thereafter, under bump metallurgy stacks are formed on the trim pads and bond pads and protective caps are formed over the trim pads and contact bumps are formed on the bond pads. The protective cap 406 works in conjunction with under bump metallurgy stack 404 to protect the trim pad 402 from environmental stresses and keeps the trim pad 402 from coming into physical or electrical contact with the contact bump 412. The protective cap 406 is preferably made of a non-corrosive and electrically conductive material such as titanium.

Providing electrically conductive protective caps above the under bump metallurgy stacks that are disposed above the trim pads protects the trim pads from environmental stresses while allowing the trim pad to maintain electrical access. This allows for wafer probing and trimming operations to be conducted during a final test prior to singulation.

FIG. 5a is a flow chart illustrating a process of fabricating integrated circuit devices wherein the trim pads are covered with an insulating material that requires two separate wafer probing steps. The process begins at step 502 with a wafer coming out of wafer Fabrication, where the trim pads and bond pads are formed on the silicon substrate and covered by under bump metallurgy stacks. In step 504, the bond pads on the dies that are on the wafer are probed and the trim pads are trimmed so that the product characteristics will meet the required specifications. Then a passivation layer, benzocyclobutane, for example, is selectively deposited in step 506 over the trim pads to isolate the bond pads. The passivation layer protects the trim pads from environmental stresses and also insulates the trim pad from any electrical contact. In step 508 contact bumps are put on bond pads. Thereafter, an epoxy protective coating is formed over the bottom surface of each die and a laser mark placed on it in step 510. This protective coating is configured to reduce chipping during wafer level chip scale package singulation.

Afterwards, in step 512, a second wafer probe takes place to test the contact bumps for functionality prior to singulating the dies on the wafer in step 514 and shipping the dies to customers in step 516.

FIG. 5b is a flow chart illustrating an advantageous process of fabricating integrated circuit devices wherein the trim pads are covered with electrically conductive protective caps and trimming and wafer probing may be done without requiring any fabrication steps therebetween in accordance with one embodiment of the present invention. The process begins at step 520 with a wafer coming out of wafer fabrication, where the trim pads and bond pads are formed on the silicon substrate and covered by under bump metallurgy stacks. Then the trim pads are covered by electrically conductive protective caps in step 522, which protects the trim pads from environmental stresses yet allows the trim pads to maintain electrical contact with the outside environment. The electrically conductive protective caps, which are preferably made from a a non-corrosive, non-wettable metal such as titanium, can be formed over the trim pads by a metal deposition process such as sputtering followed by the etching away of the metal that has been deposited over a surface where a trim pad is not located. The sputtering and the subsequent etching may take place during wafer fabrication, for example, after the under bump metallurgy stacks are formed over the bond pads and/or trim pads. Alternatively, the protective caps can be formed over the trim pads in a separate process after wafer fabrication. In step 524, contact bumps are put on bond pads. Thereafter, a epoxy backcoat, which is essentially a protective coating, is formed over the bottom surface of each die and a laser mark placed on it in step 526. This protective coating is configured to reduce chipping during wafer level chip scale package singulation. Several embodiments of the protective coating are further described in commonly assigned U.S. patent application Ser. No. 09/006,759 filed Jan. 14, 1998 entitled, "A Semiconductor Wafer Having a Bottom Surface Protective Coating" by Kao, et al., which is incorporated herein by reference.

A wafer probe is performed in step 528 to test the contact bumps for functionality and to trim the trim pads so that the die characteristics will meet the required specifications. This wafer probe takes place prior to singulating the dies on the wafer in step 530 and shipping the dies to customers in step 532. In essence, the second process differs from the first in that by forming electrically conductive protective caps over the trim pads in the second process, the first wafer probe-facilitated trimming step 504 can be eliminated to the advantages of greater efficiency and lowered costs. In an alternative embodiment, the forming of the electrically conductive protective caps over the trim pads may also be shifted to an earlier step, for example, by reversing steps 520 and 522, so that these electrically conductive protective caps would be formed during wafer fabrication, which would significantly simplify the fabrication process and lower costs.

As can be seen from the foregoing comparison between the current solution and the improved process, the improved process has the advantages of allowing lower production costs and a higher production yield. It utilizes existing technologies of depositing metal layers to the advantage of reducing costs and eliminating a process step. The wafer probing and trimming are integrated into one final testing step, which creates a more efficient alternative to the current solution which requires that the wafer be tested in two separate steps, which can be a logistics nightmare. Another advantage of the improved process is that trimming can be done during final testing, which allows a higher productivity yield since the device characteristics can be altered by trimming before singulation takes place, whereas with the current solution, devices that do not meet required specifications would have to be discarded.

Although the foregoing invention has been described in some detail for purposes of clarity of understanding, it will be apparent that certain changes and modifications may be practiced within the scope of the appended claims. For example, titanium may be used to directly cover the trim pads without first depositing the under bump metallurgy stacks over the trim pads. Accordingly, the present embodiments are to be considered as illustrative and not restrictive, and the invention is not to be limited to the details given herein, but may be modified within the scope and equivalents of the appended claims.

What is claimed is:

1. A flip chip integrated circuit device comprising:
    a die having a plurality of bond pads and at least one trim pad, the trim pad for use in trimming the die and not having a contact bump;
    contact bumps formed over the plurality of bond pads to allow electrical interconnection of the bond pads with another substrate; and
    a protective cap formed over the trim pad, the protective cap being formed from an electrically conductive material that solder does not attach well to.

2. A flip chip integrated circuit device as in claim 1 further comprising a plurality of bond pad under bump metallurgy stacks, each bond pad under bump metallurgy stack being formed intermediate between an associated one of the bond pads and its associated contact bump.

3. A flip chip integrated circuit device as in claim 2 further comprising a trim pad under bump metallurgy stack having the same composition as the bond pad under bump metallurgy stacks, the trim pad under bump metallurgy stack being formed intermediate between the trim pad and the protective cap.

4. A flip chip integrated circuit device as in claim 1 wherein the die has a plurality of trim pads, the flip chip integrated circuit device further comprising a plurality of said protective caps, each protective cap being associated with a particular one of the trim pads.

5. A flip chip integrated circuit device as in claim 1 wherein the protective cap is formed from titanium.

6. A flip chip integrated circuit device as in claim 1 wherein the protective cap is formed from a non-corrosive, non-wettable metal.

7. A flip chip integrated circuit device as in claim 1 wherein the contact bumps are made of solder.

8. An integrated circuit device comprising:
    a die having a plurality of bond pads and a plurality of trim pads, the trim pad for use in trimming the die and not having a contact bump;
    a plurality of under bump metallurgy stacks, each under bump metallurgy stack being formed over and in electrical contact with an associated one of the bond pads or trim pads;
    a plurality of contact bumps, each contact bump being attached to the under bump metallurgy stack of an associated one of the bond pads; and
    a plurality of protective caps, each protective cap being formed over the under bump metallurgy stack of an associated one of the trim pads, the protective caps being electrically conductive to permit trimming of the integrated circuit device but are non-solder wettable and non-corrosive.

9. An integrated circuit device as in claim 8 wherein the contact bumps are formed from solder.

10. An integrated circuit device as in claim 8 wherein the protective caps are formed from titanium.

11. An integrated circuit device as in claim 8, wherein the under bump metallurgy stack is comprised of:
    an underlayer;
    an interlayer; and
    an overcoat.

12. An integrated circuit (IC) package as in claim 11, wherein the underlayer is comprised of Cr and the interlayer is comprised of Cr—Cu.

13. An integrated circuit (IC) package as in claim 11, wherein the underlayer is comprised of Al and the interlayer is comprised of Ni—V.

14. An integrated circuit (IC) package as in claim 11, wherein the underlayer is comprised of TiW and the interlayer is comprised of Cu.

15. A circuit board comprising:
    a substrate having a plurality of board contacts;
    the IC package as recited in claim 8 attached to the substrate such that each of the contact bumps is coupled with an associated one of the board contacts.

* * * * *